(12) United States Patent
Mottola

(10) Patent No.: US 7,358,804 B2
(45) Date of Patent: Apr. 15, 2008

(54) AMPLIFIER TURN-ON SPEEDUP TECHNIQUE

(75) Inventor: Michael J. Mottola, San Jose, CA (US)

(73) Assignee: Micrel, Incorporated, San Jose, CA (US)

(*) Notice: Subject to any disclaimer, the term of this patent is extended or adjusted under 35 U.S.C. 154(b) by 144 days.

(21) Appl. No.: 11/385,486

(22) Filed: Mar. 20, 2006

(65) Prior Publication Data
US 2007/0216479 A1   Sep. 20, 2007

(51) Int. Cl.
H03F 1/14   (2006.01)

(52) U.S. Cl. .................................................. 330/51
(58) Field of Classification Search .................. 330/51; 381/94.5
See application file for complete search history.

(56) References Cited

U.S. PATENT DOCUMENTS 6,166,591 A * 12/2000 Schultz et al. ............... 327/544
6,271,699 B1 * 8/2001 Dowlatabadi ............... 327/170

* cited by examiner

Primary Examiner—Steven J. Mottola
(74) Attorney, Agent, or Firm—Bever, Hoffman & Harms, LLP; Jeanette S. Harms

(57) ABSTRACT

A method of reducing the settling time of an amplifier includes providing a pre-set voltage on a high gain node of the amplifier when the amplifier is disabled. This pre-set voltage can be slightly less than the regulated voltage. In this manner, when the amplifier is enabled, the high gain node can quickly reach this regulated voltage. The pre-set voltage can be applied to the high gain node by operating a switch, e.g. if the amplifier is enabled (disabled), then the switch is open (closed). A startup circuit can generate the pre-set voltage. This startup circuit can include a startup current source and a transistor connected in series between VDD and VSS. The switch can be connected to the gate and drain of the transistor. Notably, the transistor can be the same type of device as the MOS device driven by the high gain node in the amplifier.

8 Claims, 4 Drawing Sheets

...

AMPLIFIER TURN-ON SPEEDUP TECHNIQUE

BACKGROUND OF THE INVENTION

1. Field of the Invention

The present invention relates to the settling time of an amplifier and in particular to reducing that settling time by pre-setting a high gain node.

2. Discussion of the Related Art

FIG. 1A illustrates an exemplary amplifier 100 including an operational transconductance amplifier (OTA) 101 having a positive input terminal that receives an input signal Vin and a negative input terminal that receives a reference signal Vref. OTA 101 essentially generates a current based on the voltage differential between Vin and Vref. Note that the output of amplifier 100, i.e. Vout, is typically connected to a load. To respond to that load being heavy, light, or in transition, a feedback signal based on Vout can be provided as Vin, thereby forming a feedback loop. The reference voltage Vref is generally provided by a bandgap circuit. In one embodiment, Vref can be 1.2 V.

The output of OTA 101 drives the gate of an MOS device 102 as well as a compensation capacitor 104, which provides stability in the feedback loop. The source of MOS device 102 (in this case an NMOS device) can be connected between a voltage source VSS whereas the drain of MOS device 102 can be connected to a node 111. A current source 103 can be connected between a voltage source VDD and node 111.

Node 111 can be connected to the positive input terminal of a buffer stage 105. Voltage source VSS can be connected to the negative input terminal of buffer stage 105. The output of buffer stage 105 provides the output signal Vout.

To enable/disable amplifier 100 a bias circuit can be used. FIG. 1B illustrates amplifier 100 including such a bias circuit. In this embodiment, a low Enable signal (for example provided by an Enable pin) triggers the disabling of amplifier 100. This low Enable signal is buffered by an inverter 120, which outputs a logic high signal on a node 121 that turns on NMOS transistors 122 and 123. Therefore, the voltages at nodes 110 and 111 are pulled to ground. Notably, pulling node 110 to ground discharges capacitor 104.

The logic high signal on node 121 is also provided to the gate of PMOS transistor 124 (which implements current source 103 (FIG. 1A), thereby turning off that transistor. Therefore, there is nothing to prevent node 111 from pulling towards ground as provided by NMOS transistor 123. Thus, as shown by FIGS. 1A and 1B, when the low Enable signal puts amplifier 100 in its off state, amplifier 100 has no bias current through it.

In contrast, a high Enable signal triggers amplifier 100 to turn on. Inverter 120 inverts the high Enable signal and provides a logic zero signal to the gates of NMOS transistors 122 and 123, thereby turning off those transistors. The logic zero signal on node 121 turns on transistor 124. With transistor 124 conducting, i.e. with the current source enabled, a bias current is provided to node 111. In contrast, the voltage on node 110 is dependent on the output of OTA 101 and the effect of capacitor 104.

Thus, the voltages of nodes 110 and 111 of amplifier 100 reach equilibrium some time after amplifier 110 is enabled. The time to reach equilibrium is referred to as the settling time. Notably, because capacitor 104 slows any voltage increase on node 110, the settling time of that node takes much longer to settle than the voltages on other nodes (e.g. node 111) in amplifier 100. Thus, the settling time of node 110, i.e. the high gain node, controls the overall settling time of amplifier 100.

To reduce this settling time, capacitor 104 could be made smaller. Alternatively, the transconductance, i.e. the gm, of OTA 101 could be made higher. However, these solutions frequently increase the frequency response to the point that amplifier 100 begins to oscillate and therefore is no longer stable.

Therefore a need arises for a startup mechanism that ensures stability while decreasing the settling time of an amplifier.

SUMMARY OF THE INVENTION

A method of reducing the settling time of an amplifier is described. In this method, a pre-set voltage is provided on a high gain node of the amplifier when the amplifier is disabled. This pre-set voltage can be slightly less than the regulated voltage. In this manner, when the amplifier is enabled, the high gain node can quickly reach this regulated voltage.

The pre-set voltage can be applied to the high gain node by operating a switch of an amplifier pre-set circuit. Specifically, if the amplifier is enabled, then the switch is open. However, if the amplifier is disabled, then the switch is closed and provides the pre-set voltage to the high gain node.

In one embodiment, a startup circuit can generate the pre-set voltage. This startup circuit can include a startup current source connected to first voltage source (e.g. VDD). The startup circuit can further include a transistor having a gate and a drain connected to the startup current source and a source connected to a second voltage source (e.g. VSS). The switch can be connected to the gate of the transistor. Notably, the transistor can be the same type of device as the MOS device driven by the high gain node in the amplifier.

The amplifier pre-set circuit can further include an enable circuit that receives an Enable signal and controls the switch. In one embodiment, the enable circuit includes a level shifting circuit. The enable circuit can also enable/disable a current source in the amplifier.

DETAILED DESCRIPTION OF THE FIGURES

In accordance with one aspect of the invention, the overall settling time of amplifier can be significantly reduced by holding a high gain node of an amplifier at a pre-set voltage during a Disable state. This pre-set voltage is close to the regulated voltage in the amplifier. In this manner, when an Enable state occurs and the high gain node is released, the amplifier can quickly settle to this regulated voltage.

Figure 1A:
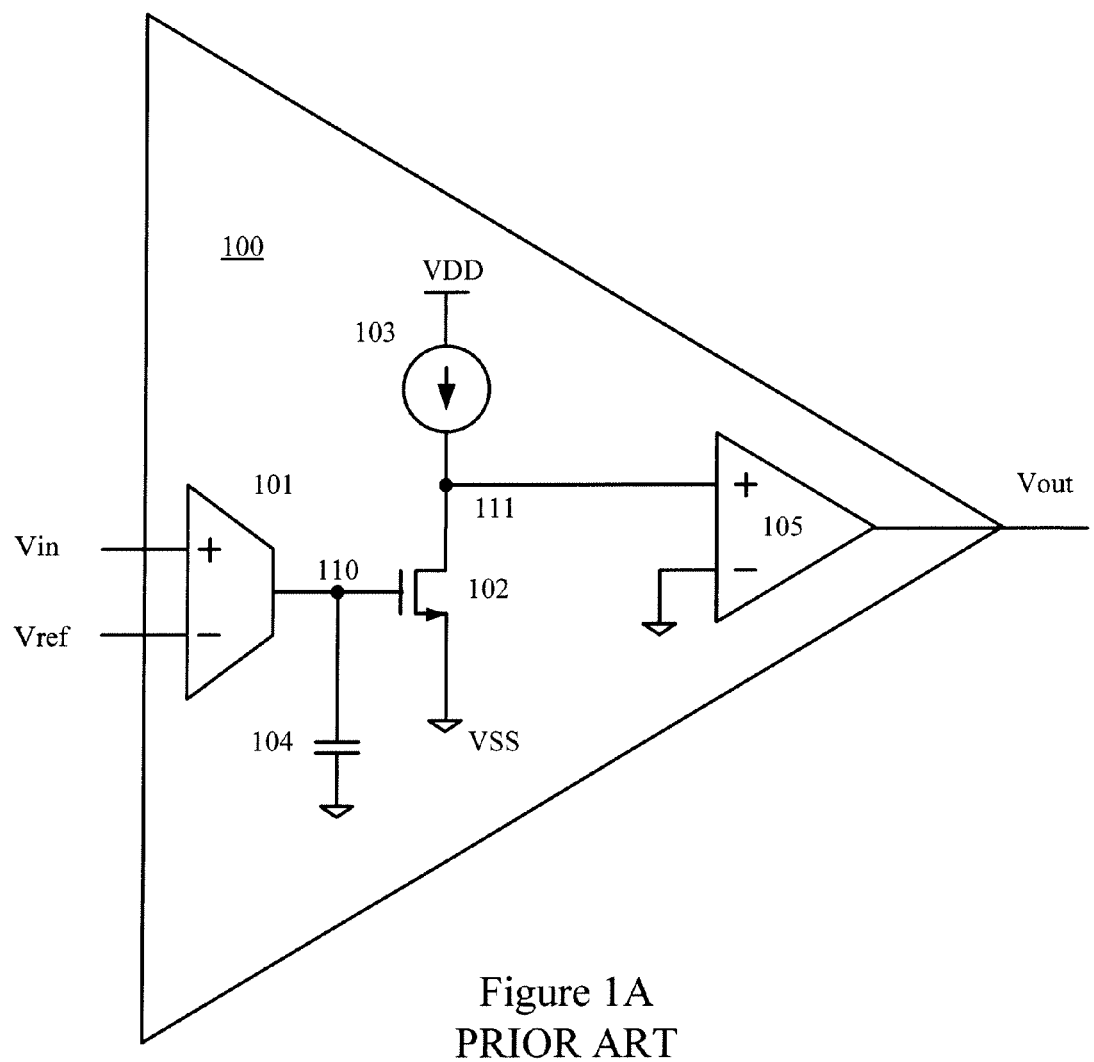
FIG. 1A illustrates a conventional amplifier.
Figure 1B:
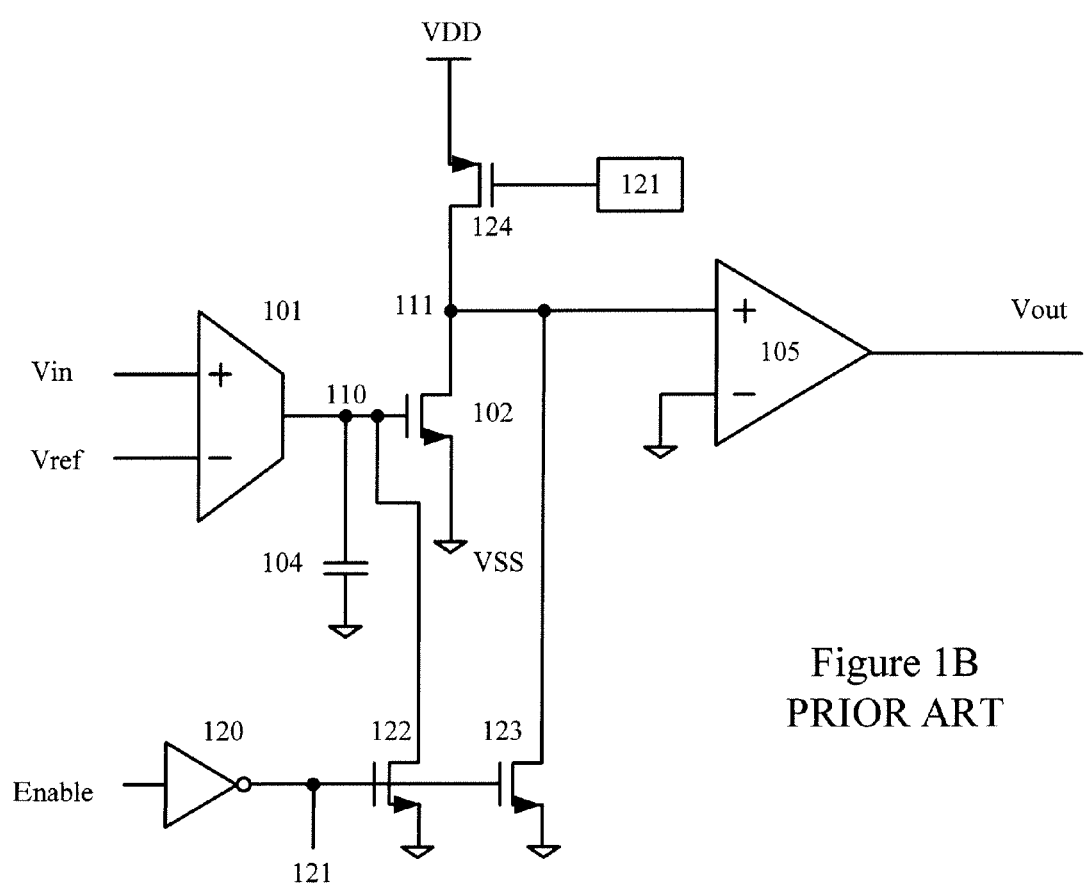
FIG. 1B illustrates the amplifier of FIG. 1A including a conventional enable circuit.
Figure 2:
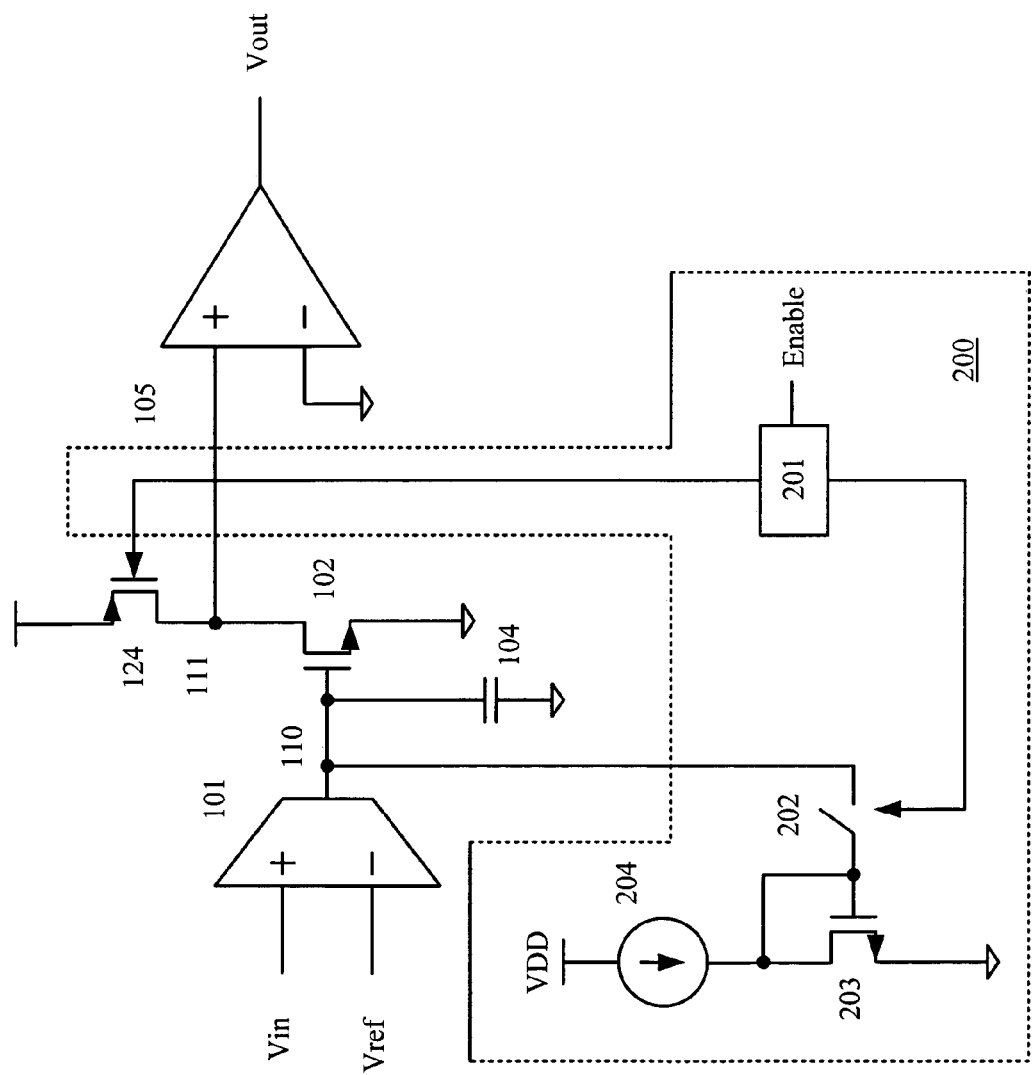
FIG. 2 illustrates an amplifier that pre-sets the voltage on a high gain node to reduce settling time.

FIG. 2 illustrates the amplifier of FIG. 1A (i.e. amplifier 100) including an amplifier pre-set circuit 200 that can provide the pre-set voltage on the high gain node (i.e. node 110). In one embodiment, a "startup" circuit including a startup current source 204 and a transistor 203 can generate the pre-set voltage. The startup current source 204 can be connected between a voltage source VDD and the drain of NMOS transistor 203. The source of NMOS transistor 203 can be connected to a voltage source VSS. The gate and drain of NMOS transistor 203 can be connected to a switch 202, which is controlled by an Enable signal.

Note that startup current source 204 is essentially a DC path from a voltage supply to the internal circuit and is always on. Thus, the startup circuit including startup current source 204 also serves the function of keeping a small amount of current flowing when the voltage supply VDD is up to ensure the flow of amplifier currents when the amplifier is enabled. In one embodiment, startup current source 204 can be generated in a bandgap circuit.

In amplifier pre-set circuit 200, an Enable signal can be provided to an enable circuit 201. In one embodiment, enable circuit 201 can include a buffer or other appropriate logic. In another embodiment, enable circuit 201 can be implemented as a level shifter circuit. For example, enable circuit 201 could receive an Enable signal that is ground or 1 V (e.g. 0 V=disable state, 1 V=enable state), yet drive its output using VSS or VDD.

In one embodiment, a low Enable signal can close switch 202 and disable the amplifier. With switch 202 closed, the gates of NMOS transistor 203 and MOS device 102 receive the same voltage. Notably, NMOS transistor 203 and MOS device 102 are closely related devices. Specifically, NMOS transistor 203 and MOS device 102 are transistors created by the same process on the same die. MOS device 102 can be a composite device including many NMOS transistors. In accordance with one aspect of the invention, the startup current through transistor 203 and the nominal working current through MOS device 102 can be proportional.

For example, if current source 103 provides 10 μamps, then MOS device 102 would sink 10 μamps when the amplifier is in its regulated state. If startup current source 204 is only 1 μamp, then transistor 203 can be sized such that the voltage across transistor 203 is close to the voltage across MOS device 102 in its regulated state.

Capacitor 104 can charge to that pre-set voltage and can substantially maintain that pre-set voltage for a period of time even when switch 202 is open (i.e. when the Enable signal is high). In this manner, node 110, i.e. the high gain node of the amplifier, can settle quickly to its regulated value when the amplifier is enabled.

Figure 3:
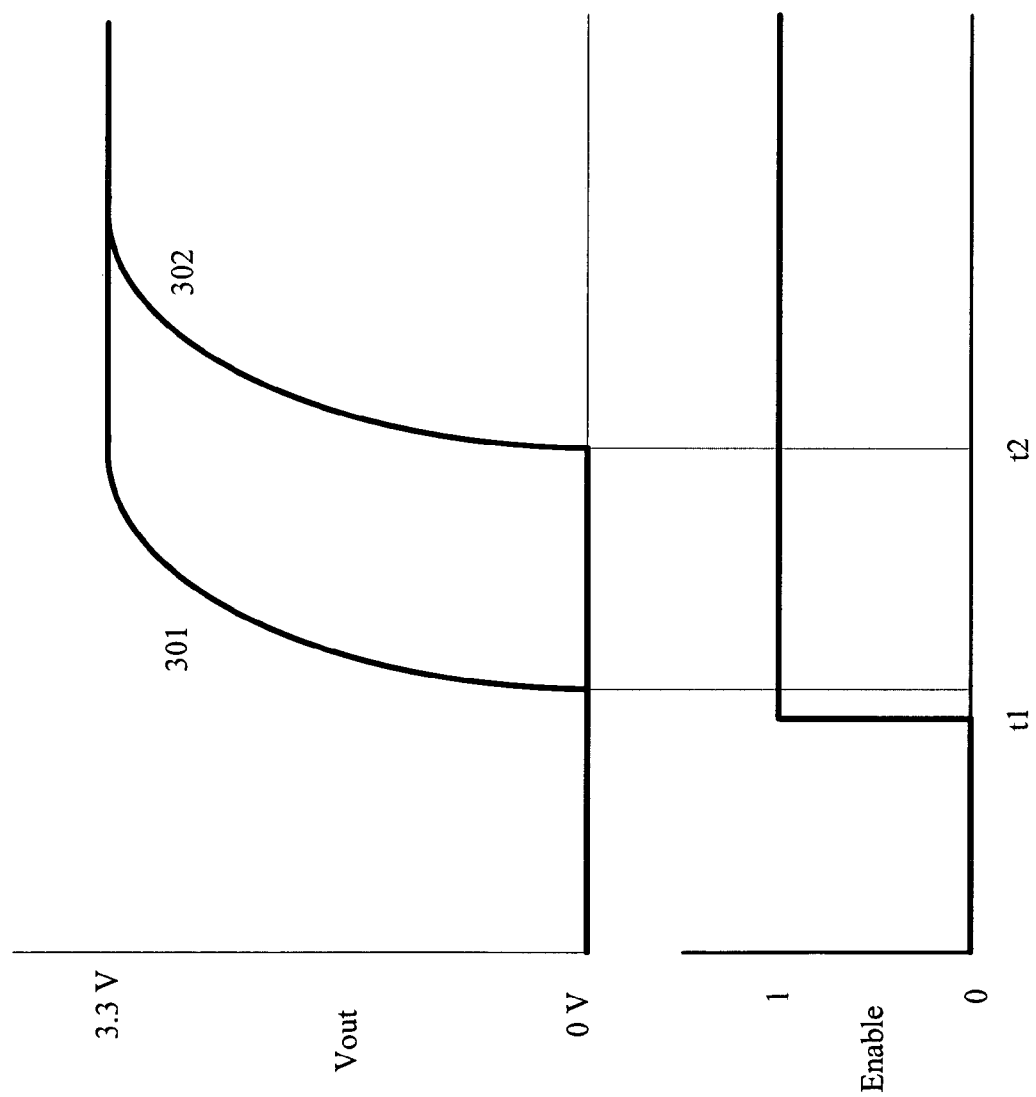
FIG. 3 illustrates the signal waveforms of Enable and Vout, both with and without the pre-set circuit.

Note that amplifier pre-set circuit 200 changes the start-up time rather than the time constant of the amplifier. For example, FIG. 3 illustrates the signal waveforms of Enable and Vout, both with and without pre-set circuit 200. Specifically, Vout with amplifier pre-set circuit 200 can be represented by waveform 301, whereas Vout without amplifier pre-set circuit 200 can be represented by waveform 302. The time constant, which is based on the gm of OTA 101, the gain of the feedback loop from Vout back to Vin, and the size of capacitor 104, does not change as shown by the curve similarity of waveforms 301 and 302.

Notably, when the Enable signal goes high at time t1, thereby enabling the amplifier, Vout as represented by waveform 301 almost immediately starts to transition to the regulated Vout signal (e.g. 3.3 V). As indicated above, this transition can begin very close to time t1 because node 110 has a pre-set voltage already close to the threshold of MOS device 102. In contrast, Vout as represented by waveform must delay its transition until time t2. The time delay between time t1 and t2 is because node 110 without amplifier pre-set circuit 200 must transition from 0 V (not the pre-set voltage) to the regulated voltage. Note that in addition to reducing the settling time of the amplifier, the pre-set voltage on the high gain node of the amplifier can also advantageously minimize the overshoot of Vout.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, all n-type devices could be changed to be p-type devices and vice versa. Current sources can be implemented using any known components. The amplifier pre-set circuit described herein can be used with any amplifier configuration. Accordingly, it is intended that the scope of the invention be defined by the following Claims and their equivalents

The invention claimed is:

1. An amplifier pre-set circuit comprising:
a switch connected to a high gain node of the amplifier, wherein if the amplifier is enabled, then the switch is open, and wherein if the amplifier is disabled, then the switch is closed and provides a pre-set voltage to the high gain node; and
a startup circuit for providing the preset voltage, the startup circuit including a startup current source connected to a transistor, the transistor being a same type as an MOS device in the amplifier, the MOS device being driven by the high gain node, wherein the preset voltage is the same or almost the same as the high gain node voltage.

2. The amplifier preset circuit of claim 1, wherein the startup current source is connected between a first voltage source and a drain of the transistor, a gate of the transistor is connected to the drain and the switch, and a source of the transistor is connected to a second voltage source.

3. The amplifier pre-set circuit of claim 1, further including an enable circuit that receives an Enable signal and controls the switch.

4. The amplifier pre-set circuit of claim 3, wherein the enable circuit includes a level shifting circuit.

5. The amplifier pre-set circuit of claim 3, wherein the enable circuit also enables/disables a current source in the amplifier.

6. A method of reducing a settling time of an amplifier, the method comprising:
providing a pre-set voltage on a high gain node of the amplifier when the amplifier is disabled,
wherein providing the pre-set voltage includes connecting a startup circuit to the high gain node,
wherein the startup circuit includes a transistor, which is a same type as an MOS device driven by the high gain node, the pre-set voltage being a voltage on a drain of the transistor.

7. A method of reducing a settling time of an amplifier, the method comprising:
providing a preset voltage on a high gain node of the amplifier when the amplifier is disabled,
wherein providing the preset voltage includes connecting a startup circuit to the high gain node,
wherein the startup circuit generates the preset voltage, which is matched to the threshold voltage of an MOS device in the amplifier, the MOS device being driven by the high gain node.

8. The method of claim 7, wherein the startup circuit includes a transistor, which is a same type as the MOS device, the pre-set voltage being a voltage on a drain of the transistor.

* * * * *